(12) United States Patent
Yun

(10) Patent No.: US 8,934,301 B2
(45) Date of Patent: Jan. 13, 2015

(54) MEMORY CONTROLLER FOR MULTI-LEVEL MEMORY DEVICE AND ERROR CORRECTING METHOD

(75) Inventor: Eun-Jin Yun, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 195 days.

(21) Appl. No.: 13/597,447

(22) Filed: Aug. 29, 2012

(65) Prior Publication Data

US 2013/0170296 A1 Jul. 4, 2013

(30) Foreign Application Priority Data

Jan. 3, 2012 (KR) ........................ 10-2012-0000589

(51) Int. Cl.
*G11C 11/34* (2006.01)
(52) U.S. Cl.
USPC ............ 365/185.09; 365/185.03; 365/185.19; 365/185.22; 365/185.3

(58) Field of Classification Search
USPC .............. 365/185.09, 185.03, 185.19, 185.3, 365/185.22; 714/702, 746
See application file for complete search history.

(56) References Cited

U.S. PATENT DOCUMENTS

| | | | |
|---|---|---|---|
| 2008/0244338 A1* | 10/2008 | Mokhlesi et al. | 714/702 |
| 2009/0210776 A1 | 8/2009 | Cho et al. | |
| 2009/0319843 A1* | 12/2009 | Meir et al. | 714/746 |
| 2010/0274951 A1 | 10/2010 | Fang et al. | |
| 2010/0318874 A1 | 12/2010 | Hung et al. | |
| 2011/0185251 A1 | 7/2011 | d'Abreu et al. | |

* cited by examiner

*Primary Examiner* — Douglas King
*Assistant Examiner* — Mohammed A Bashar
(74) *Attorney, Agent, or Firm* — Volentine & Whitt, PLLC

(57) ABSTRACT

An error correcting method of a memory controller which controls a nonvolatile memory device includes judging whether first read data read from the nonvolatile memory device is correctable; reading second read data from the nonvolatile memory device when the first read data is uncorrectable; and correcting an error of the first read data based on error information of the second read data and error information of the first read data.

20 Claims, 16 Drawing Sheets

US 8,934,301 B2

MEMORY CONTROLLER FOR MULTI-LEVEL MEMORY DEVICE AND ERROR CORRECTING METHOD

CROSS-REFERENCE TO RELATED APPLICATIONS

A claim for priority under 35 U.S.C. §119 is made to Korean Patent Application No. 10-2012-0000589 filed Jan. 3, 2012, the subject matter of which is hereby incorporated by reference.

BACKGROUND

The inventive concept relates generally to semiconductor memory devices, and more particularly, controllers for multi-level memory devices and error correcting methods.

Semiconductor memory devices are a vital microelectronic component commonly found in digital logic systems, such as computers, and microprocessor-based applications ranging from satellites to consumer electronics. Thus, advances in the fabrication of semiconductor memory devices, including process enhancements and circuit-design-related developments that allow scaling to higher memory densities and faster operating speeds, improve performance standards across a broad range of products.

Semiconductor memory devices generally include volatile memory devices, such as random access memory (RAM) devices, and nonvolatile memory devices. In RAM devices, data is stored by either establishing the logic state of a bistable flip-flop such as in a static random access memory (SRAM), or by charging/discharging a capacitor in a dynamic random access memory (DRAM). In both SRAM and DRAM devices, data remains stored only so long as power is applied.

Mask Read-Only Memory (MROM), Programmable Read-Only Memory (PROM), Erasable Programmable Read-Only Memory (EPROM), and Electrically Erasable Programmable Read-Only Memory (EEPROM) devices are examples of nonvolatile memory devices that are capable of retaining stored data in the absence of applied power. Nonvolatile memory devices may store data on a be permanent or reprogrammable basis depending on the fabrication technology used to implement the constituent memory cells and access circuitry. Nonvolatile semiconductor memories are used to store program and microcode storage in a wide variety of applications in the computer, avionics, telecommunications, and consumer electronics industries. Single-chip combinations of volatile and nonvolatile memory storage modes are available in devices such as nonvolatile SRAM (nvRAM) for use in systems that require fast, reprogrammable nonvolatile memory. In addition, dozens of special memory architectures have evolved which contain some additional logic circuitry to optimize their performance for application-specific tasks.

Mask Read-Only Memory (MROM), Programmable Read-Only Memory (PROM) and Erasable Programmable Read-Only Memory (EPROM) are not readily reprogrammable and require the application of external devices to erase and/or write new data. In contrast, Electrically Erasable Programmable Read-Only Memory (EEPROM) nonvolatile memory devices are electrically erasable and writable, and may, thus, be readily applied to auxiliary memories or system programming memories that require continuous update.

SUMMARY

In one embodiment the inventive concept provides a memory system including a memory controller controlling a nonvolatile memory device having a memory cell array of multi-level memory cells (MLC), wherein the memory system includes an error correcting circuit (ECC) generating parity data capable of correcting "Q" erroneous bits in read data retrieved from the memory device, where Q is a natural number, a correction method, comprising; retrieving first read data from a plurality of the MLC commonly coupled to a word line in response to a read command, determining whether or not the first read data is correctable in view of first parity data generated by the ECC from the first read data, upon determining that the first read data is not correctable, reading second read data from the plurality of the MLC and obtaining error information for the second read data, and modifying at least one erroneous bit in the first read data based on the error information for the second read data and error information for the first read data.

In another embodiment the inventive concept provides a memory system, comprising; a memory controller configured to control operation of a nonvolatile memory device and including an error correcting circuit (ECC) that generates parity data capable of correcting "Q" erroneous bits in read data retrieved from the memory device, where Q is a natural number, and the nonvolatile memory device includes a memory cell array of multi-level memory cells (MLC), wherein the memory controller is further configured to retrieve first read data from a plurality of the MLC commonly coupled to a word line in response to a read command, determine whether or not the first read data is correctable in view of first parity data generated by the ECC from the first read data, upon determining that the first read data is not correctable reading second read data from the plurality of the MLC and obtaining error information for the second read data, and modifying at least one erroneous bit in the first read data based on the error information for the second read data and error information for the first read data.

BRIEF DESCRIPTION OF THE DRAWINGS

Certain embodiments of the inventive concept will be described hereafter with reference to the following drawings.

DETAILED DESCRIPTION

Figure 1A:
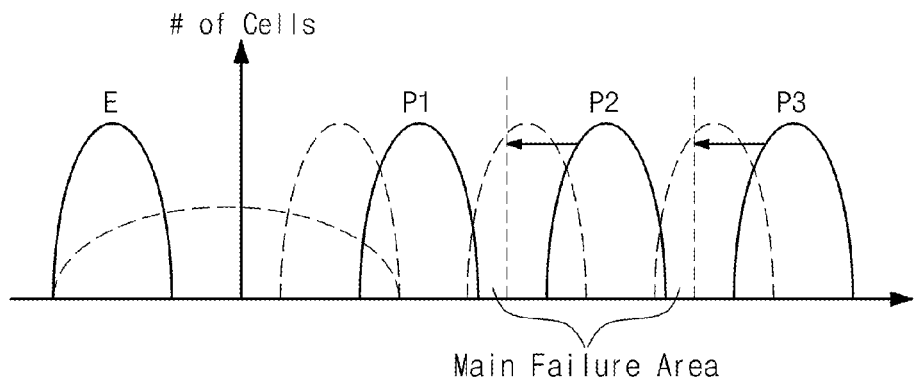
FIGS. 1A, 1B and 1C are diagrams describing various factors causing fail bits.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1B:
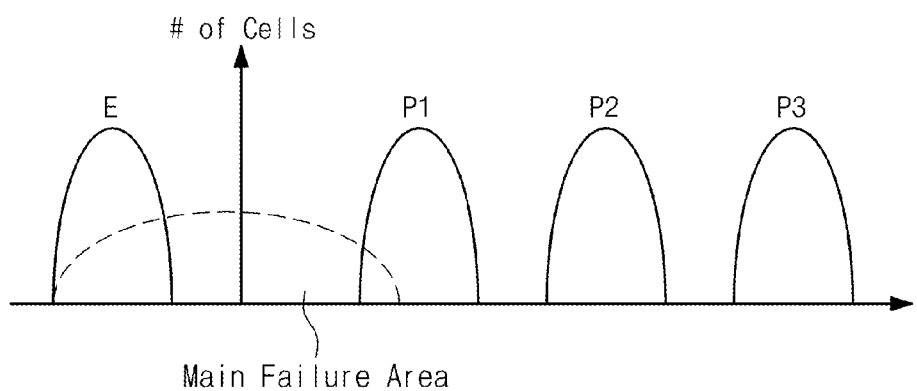
Figure 1C:
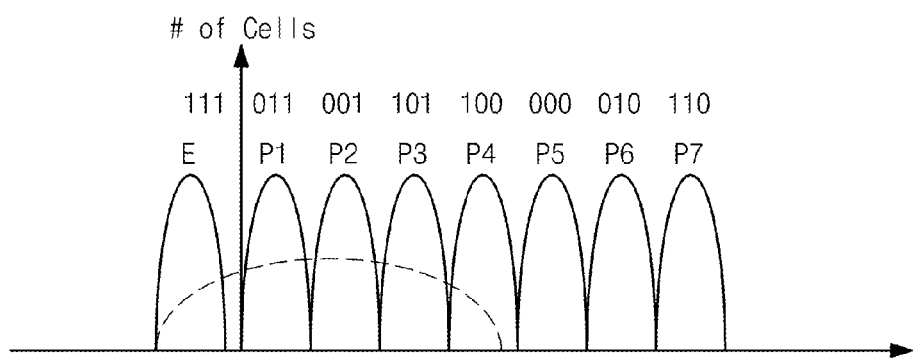

FIGS. 1A, 1B and 1C are diagrams describing various factors causing fail bits.

The constituent memory cells of a nonvolatile memory device may store data using a charge storing element such as a floating gate, a charge trap layer, and the like. The threshold voltage of each memory cell will vary according to the amount of electrical charge accumulated on the charge storing element. When 1-bit data is stored by a memory cell, two (2) threshold voltage distributions corresponding to an erase state and a program state are used. When 2-bit data is stored by a memory cell, four (4) threshold voltage distributions corresponding to an erase state and three program states are used. And when 3-bit data is stored by a memory cell, eight (8) threshold voltage distributions corresponding to an erase state and seven program states are used. However, the nature and quality of these various threshold voltage distributions is determined according to a number of factors such as charge loss, disturbance, and the like.

Referring to FIG. 1A and assuming the use of 2-bit multi-level memory cells (MLC), charge loss may cause a systemic downward (or reduced) shift from an intended set of threshold voltage distributions (illustrated by solid lines) to a set of lower threshold voltage distributions (illustrated by dotted lines). Of particular note, if the threshold voltage distributions corresponding to the intermediate program states P2 and P3 are reduced below their respective read voltages, a number of fail bits (i.e., stored data bits detected as erroneous or errant bits) will markedly increase.

Referring to FIG. 1B and again assuming the use of 2-bit MLC, certain well understood memory cell array "disturbance(s)" may cause variation(s) in the shape or breadth of one or more threshold voltage distribution(s). In certain circumstances, a disturbance may shift upward (or increase) a threshold voltage distribution (e.g., the threshold voltage distribution corresponding to the erase state E). Disturbances may be caused by a number of events in the memory cell array, such as iterations of a read operation, word line or bit line coupling generated during a program operation, and the like. Disturbance related variation in the threshold voltage distribution corresponding to the erase state E may be intensified according to a fine process. And as the threshold voltage distribution for the erase state E overlaps the adjacent threshold voltage distribution for the first program state (e.g., P1), there will be a marked increase in the number of fail bits.

Referring to FIG. 1C and now assuming the use of 3-bit MLC, the number of fail bits may even more markedly increase as the threshold voltage distribution for the erase state E expands (or broadens) to overlap multiple threshold voltage distributions for respective program states (e.g., P1, P2, and P3).

Thus, fail bits may be generated due to disturbance(s) and/or charge loss, as illustrated examples. Any increase in the number of fail bits will reduce the reliability of the nonvolatile memory device, and may necessitate the use of error correction capability (ECC) and related error detection and/or correction circuits and operating methods.

ECC circuitry may be configured to add so-called "parity data" (e.g., data derived from and subsequently used to detect and/or correct errant bits in (payload or input) data received by a memory system). Both input data and related parity data are stored in the nonvolatile memory device during a program operation. During a subsequent read operation directed to the stored data, the parity data may be read from the nonvolatile memory device and used to detect and/or correct the bit errors in the stored data. The number of correctable bits is a function of the number of bits of parity data. Thus, the "size" of the parity data determines, at least in part, the error correction coverage or capabilities of a memory system ECC functionality. If a number of erroneous bits in identified read data exceeds the error correction coverage of a particular ECC approach, it may be difficult if not impossible to correct and successfully retrieve the read data from the nonvolatile memory device. However, there are practical limits on the error correction capacity of contemporary memory devices and memory systems. Such limits include the size of available parity data, the computational time and resources required by increasingly complicated ECC engines, etc.

However, within embodiments of the inventive concept, it is possible to correct one or more data error(s) conventionally falling outside of a defined error correction capacity without necessarily increasing the size of the corresponding parity data or demanding additional ECC time and resources. As will be understood hereafter, and as distinguish from conventional nonvolatile memory devices incorporating MLC, at least one data error conventionally falling outside a defined error correction capacity may be corrected using parity data conventionally insufficient to correct the at least one data error.

In order to more fully understand the foregoing. it should be noted that MLC physically arranged along a common word line may be used to store multiple pages of data (e.g., 2-bit MLC storing 2 pages of data, 3-bit MLC storing 3 pages of data, etc.). Within such MLC page configurations, a conventionally defined error correction capacity for the nonvolatile memory device may effectively be "expanded" without variation in the hardware of an implicate error correction circuit and without increasing the size of the parity data derived from stored data. This expansion is enabled by use of a data correction method according to embodiments of the inventive concept using parity data that would otherwise be insufficient to correct a predetermined number of erroneous bits (i.e., parity data that would establish an insufficient error correction capacity). In this manner, the reliability of the nonvolatile memory device may be improved without an expansion of ECC resources (e.g., parity data size, computational time, ECC complexity, etc.).

Figure 2:
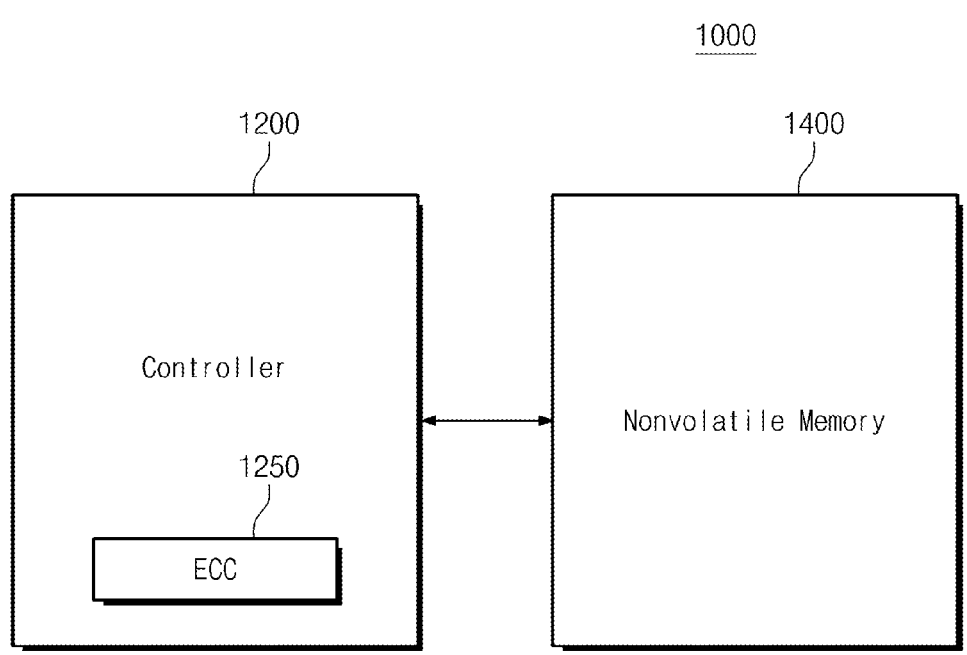
FIG. 2 is a block diagram illustrating a memory system according to an embodiment of the inventive concept.

FIG. 2 is a block diagram generally illustrating a memory system according to an embodiment of the inventive concept.

Referring to FIG. 2, a memory system 1000 comprises a memory controller 1200 and a nonvolatile memory device 1400. The memory controller 1200 may be configured to control the nonvolatile memory device 1400 according to an internal system, request (e.g., an operation associated with sudden power-off, background operations such as merge, garbage collection, etc.), as opposed to external requests (e.g., read and write operations) received from an external circuit (e.g., a host).

Thus, the nonvolatile memory device 1400 is assumed to operate under the control of the memory controller 1200 and is further assumed to serve as a data storage medium for received data. The storage medium may be formed of one or more memory chips. The nonvolatile memory device 1400 may communicate with the memory controller 1200 via one or more channels. The nonvolatile memory device 1400 may include a NAND flash memory device, for example.

The memory controller 1200 includes an error correcting circuit (similarly designated "ECC") 1250. The ECC 1250 may be configured to encode data to be stored in the nonvolatile memory device 1400. For example, the ECC 1250 may be configured to generate parity data based on received "program data" to be stored in the nonvolatile memory device 1400. The parity data is assumed to be stored in MLC coupled to a selected word line of the nonvolatile memory device 1400 storing the program data. The ECC 1250 may be configured to correct error(s) in subsequently retrieved "read data" from the nonvolatile memory device 1400 based on associated ECC parity data. It is further assumed that the ECC 1250 is able to detect locations for erroneous bits included in the read data and generate corresponding error location (or property) information. The error location information is one type of "error information" for read data (i.e., information related to or characterizing one or more erroneous bits identified in the read data). The detected location information may be temporarily stored in a memory or register within the memory controller 1200.

When a number of erroneous bits (and/or their respective locations) detected in read data exceeds a defined error correction capacity for the memory device, the read data is determined to be "uncorrectable" by the ECC 1250.

However, for embodiments of the inventive concept, in a case where the read data is deemed uncorrectable by the ECC 1250, the memory controller 1200 may nonetheless correct at least one of the erroneous bits in the uncorrectable read data using the error location information that is stored in the same physical location (MLC) as the uncorrectable read data. Thereafter, following correction of the at least one erroneous bit in the "uncorrectable" read using the error location information, the read data may no longer fall outside of the error correction capacity of the ECC 1250 as defined by the provided ECC parity data. As a result, a number of erroneous bits that would fall outside the error correction capabilities of the ECC 1250 may be corrected without expanding the corresponding ECC resources.

Figure 3:
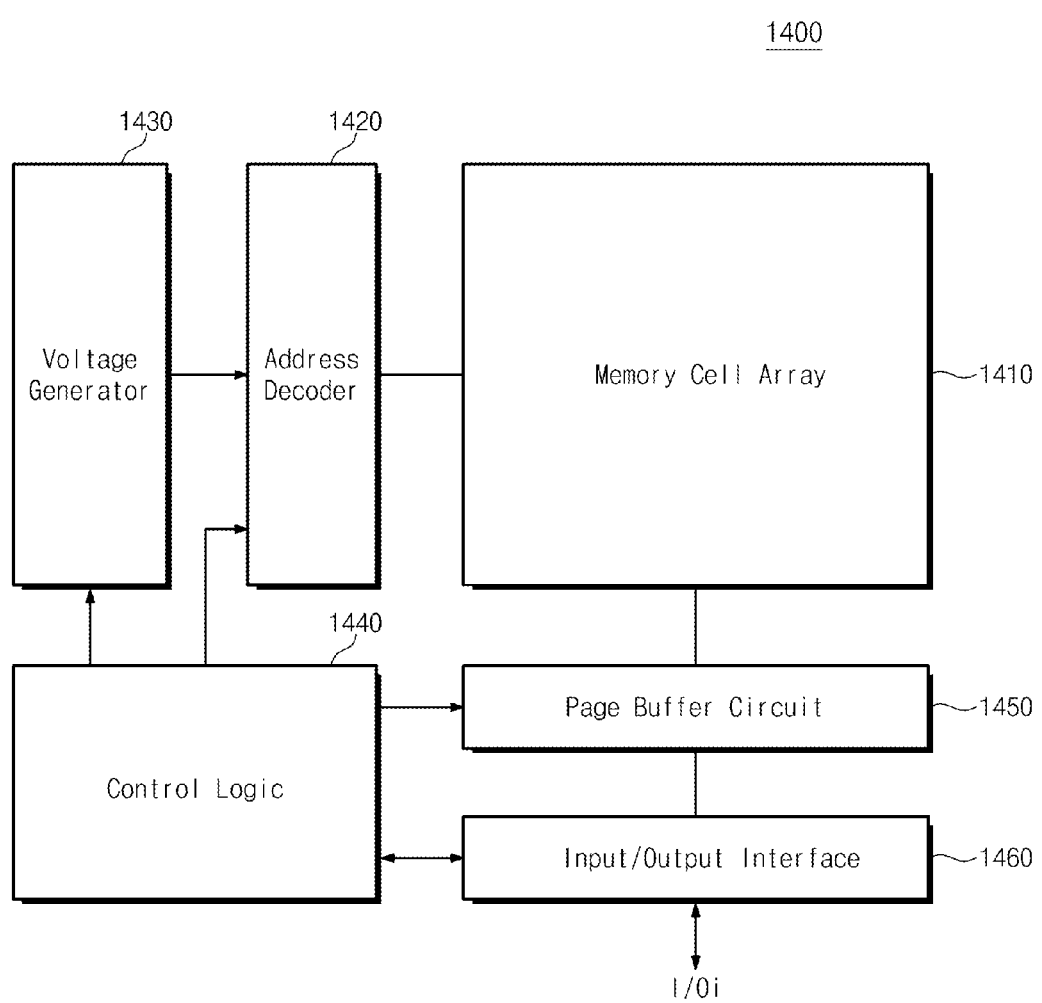
FIG. 3 is a block diagram further illustrating the nonvolatile memory device of FIG. 2.

FIG. 3 is a block diagram further illustrating the nonvolatile memory device of FIG. 2.

The nonvolatile memory device 1400 may be a NAND flash memory device, for example. However, it is well understood that the nonvolatile memory device 1400 is not limited to the NAND flash memory device. For example, the inventive concept may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device 1400 can be implemented to have a three-dimensional array structure. A nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate.

Referring to FIG. 3, the nonvolatile memory device 1400 may include a memory cell array 1410, an address decoder 1420, a voltage generator 1430, control logic 1440, a page buffer circuit 1450, and an input/output interface 1460.

The memory cell array 1410 may include memory cells arranged at intersections of rows (e.g., word lines) and columns (e.g., bit lines). Each memory cell may store 1-bit data or multi-bit data (M being an integer of 2 or more). The address decoder 1420 may be controlled by the control logic 1440, and may perform selecting and driving operations on rows (e.g., word lines, a string selection line(s), a ground selection line(s), a common source line, etc.) of the memory cell array 1410. The voltage generator 1430 may be controlled by the control logic 1440, and may generate voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420. The control logic 1440 may be configured to control an overall operation of the nonvolatile memory device 1400.

The page buffer circuit 1450 may be controlled by the control logic 1440, and may be configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input/output interface 1460 may be controlled by the control logic 1440, and may interface with an external device. Although not illustrated in FIG. 3, the input/output interface 1460 may include a column decoder configured to select page buffers of the page buffer circuit 1450 by a predetermined unit, an input buffer receiving data, an output buffer outputting data, and the like.

Figure 4:
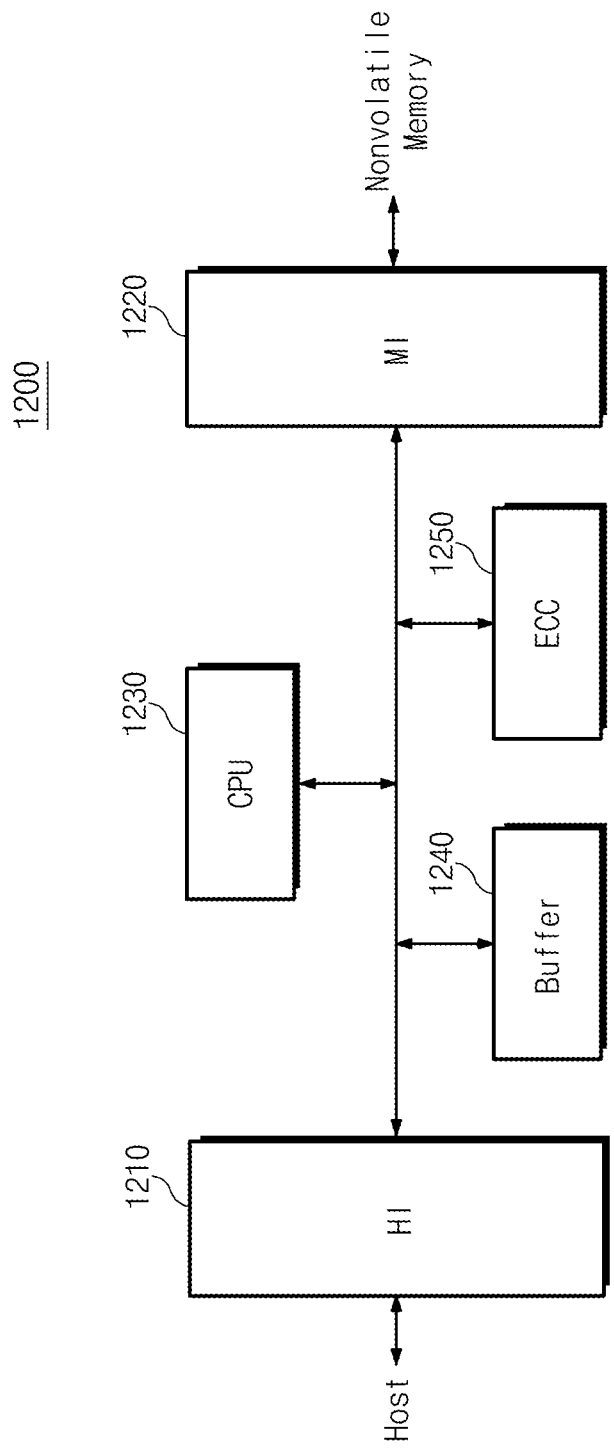
FIG. 4 is a block diagram illustrating the memory controller of FIG. 2.

FIG. 4 is a block diagram further illustrating the memory controller of FIG. 2. Referring to FIG. 4, the controller 1200 may include a host interface 1210 as a first interface, a memory interface 1220 as a second interface, a CPU 1230, a buffer memory 1240, and the ECC 1250.

The host interface 1210 may be configured to interface with an external device (for example, a host), and the memory interface 1220 may be configured to interface with a nonvolatile memory device 1400 illustrated in FIG. 2. The CPU 1230 may be configured to control an overall operation of the controller 1200. The CPU 1230 may be configured to operate firmware such as Flash Translation Layer (FTL), for example. The buffer memory 1240 may be used to temporarily store data transferred from an external device via the host interface 1210 or data transferred from the nonvolatile memory device 1400 via the memory interface 1220. The ECC 1250 may be configured to encode data to be stored in the nonvolatile memory device 1400 and to decode data read out from the nonvolatile memory device 1400.

Although not illustrated in figures, the memory controller 1200 may further include a randomizer/de-randomizer which is configured to randomize program data to be stored in the nonvolatile memory device 1400 and to de-randomize read data retrieved from the nonvolatile memory device 1400. One example of the randomizer/de-randomizer that may be thus incorporated in disclosed, for example, in published U.S. Patent Application No. 2010/0088574, the subject matter of which is hereby incorporated by reference.

In the illustrated embodiment of FIG. 4, the host interface 1210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multi-drop Bus, etc.

Figure 5:
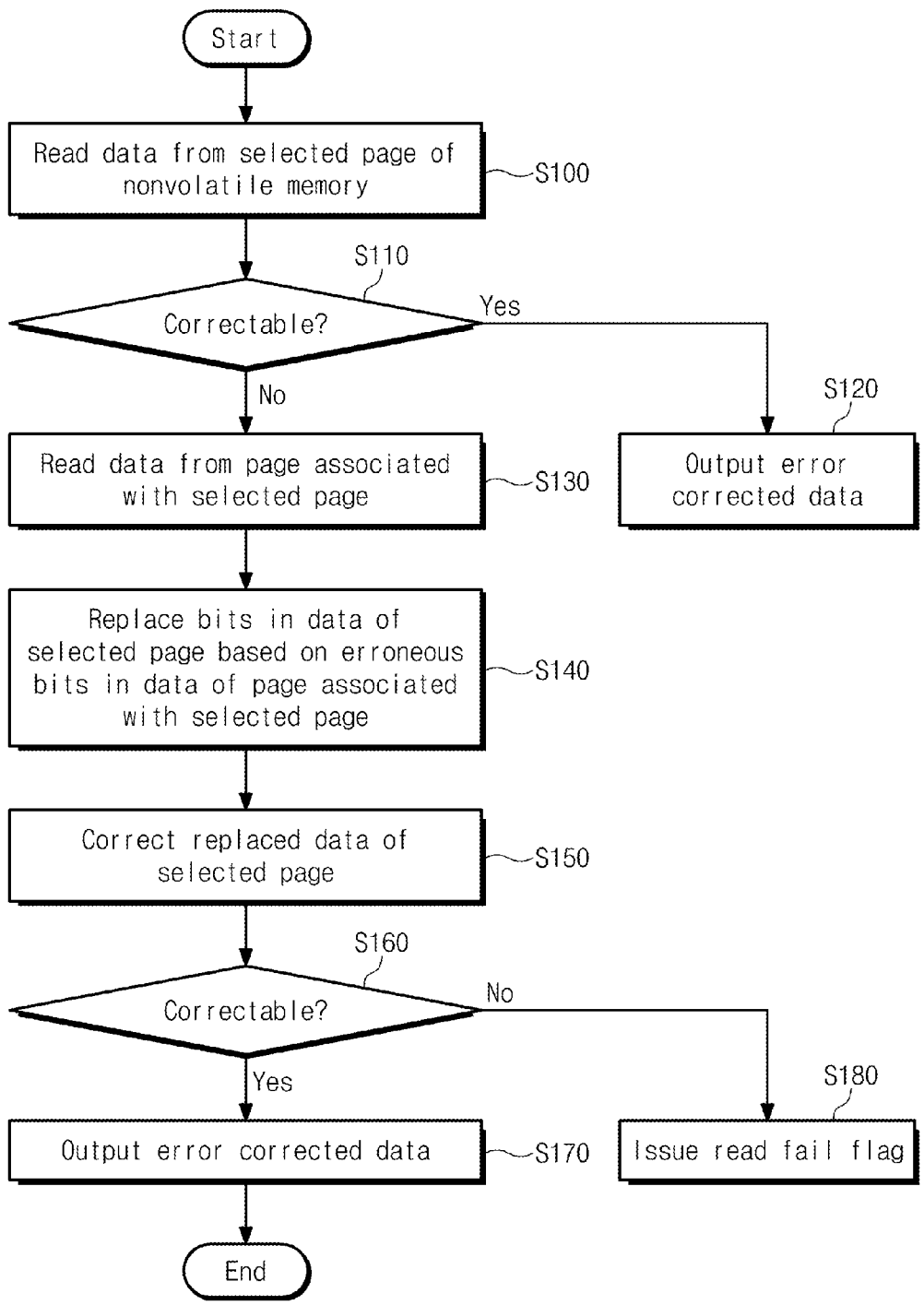
FIG. 5 is a flowchart summarizing a data correction method for a memory system according to an embodiment of the inventive concept.

FIG. 5 is a flowchart summarizing a data correction method for a memory system according to an embodiment of the inventive concept.

For purposes of description, it is assumed that 2-bit data is stored in the MLC of a nonvolatile memory device. The MLC are further assumed to be coupled to a common word line and are configured to store two pages of data (i.e., 2-page data) including a Least Significant Bit (LSB) page data and a Most Significant Bit (MSB) page data. However, the inventive concept is not limited thereto. For example, the inventive concept may be applied to a nonvolatile memory device storing M-bit data per MLC, where M is an integer greater than 2.

In operation S100, the memory controller 1200 controls the nonvolatile memory device 1400 to output requested read data. For example, a read command and a corresponding address may be sent to the nonvolatile memory device 1400 from the memory controller 1200. The nonvolatile memory device 1400 may read data on a page basis in response to the address provided by the memory controller 1200. In operation S110, the memory controller 1200 determines whether the read data is correctable given the established error correction capabilities of the memory system.

For example, the ECC 1250 of the memory controller 1200 may detect a number of (and/or corresponding locations for) erroneous bits in the read data using parity data previously derived from the read data (e.g., during a previous program operation). If the number of erroneous bits exceeds the established error correction coverage for the memory system, the read data will be deemed uncorrectable (S110=NO). Otherwise (S110=YES), the memory controller 1200 merely corrects the retrieved read data using the corresponding parity data and outputs the error corrected data (S120).

It is assumed that the location information for the detected erroneous bits and the read data designated by the ongoing read command (hereinafter, "first read data") is temporarily stored in the memory controller 1200.

Thus, if the number of detected erroneous bits falls outside the established error correction coverage, the method may proceed to operation S130, in which the memory controller 1200 controls the nonvolatile memory device 1400 to retrieve and output another page of data (hereafter, "second read data") that is stored in the same physical location(s) MLC as the with the first read data. For example, if a first read page was the MSB page data stored in a plurality of MLC coupled to a selected word line, then the second read page would be the corresponding LSB page stored in the same plurality of MLC. Alternatively, and still assuming 2-bit MLC are being read from, the first read data may be the LSB page data stored in a plurality of MLC and the second read data may be the corresponding MSB page data stored in the same plurality of MLC. This is one example drawn to the use of 2-bit MLC where LSB page data and MSB page data are said to "be associated' with one another.

The ECC 1250 of the memory controller 1200 may detect locations of erroneous bits included in the second read data based on parity data corresponding to the second read data, and then determine whether the number of detected erroneous bits in the second read data exceeds the established error correction coverage. In the event that the number of detected erroneous bits does not exceed the error correction coverage, the locations of erroneous data in the first read data may be compared with respective location of erroneous data in the second read data. Then, an erroneous bit identified in the first read data and having a same error location as an erroneous bit identified in the second read data may be replaced (e.g., by simply inverting the current bit value). This replacement may be made on a erroneous bit location by erroneous bit location. That is, in operation S140, one or more erroneous bits of the first read data may be respectively replaced with an inverted bit value based on the location of erroneous bits identified in the second read page. This erroneous bit replacement may be sufficient to reduce the overall number of erroneous bits in the first read data to make the first read data "normally" correctable by the memory controller 1200 using the established capabilities of the ECC 1250.

In operation S150, following replacement of one or more erroneous bits in the first read data to generate resulting "modified first read data", a determination is made by the memory controller as to whether the modified first read data is correctable using the parity data previously established for the first read data (i.e., using the normal error correction capabilities of the memory device). In the event that the modified first read data is correctable (S160=YES), the modified first read data is corrected and error corrected data is output in operation S170. Otherwise (S160=NO), the first read data is determined to be uncorrectable and a read fail flag (or similar memory device indication) is issued in operation S180.

Additionally, a read fail flag or similar indication may be generated when the number of erroneous bits in the second read data exceeds the established error correction coverage of the memory device.

Figure 6:
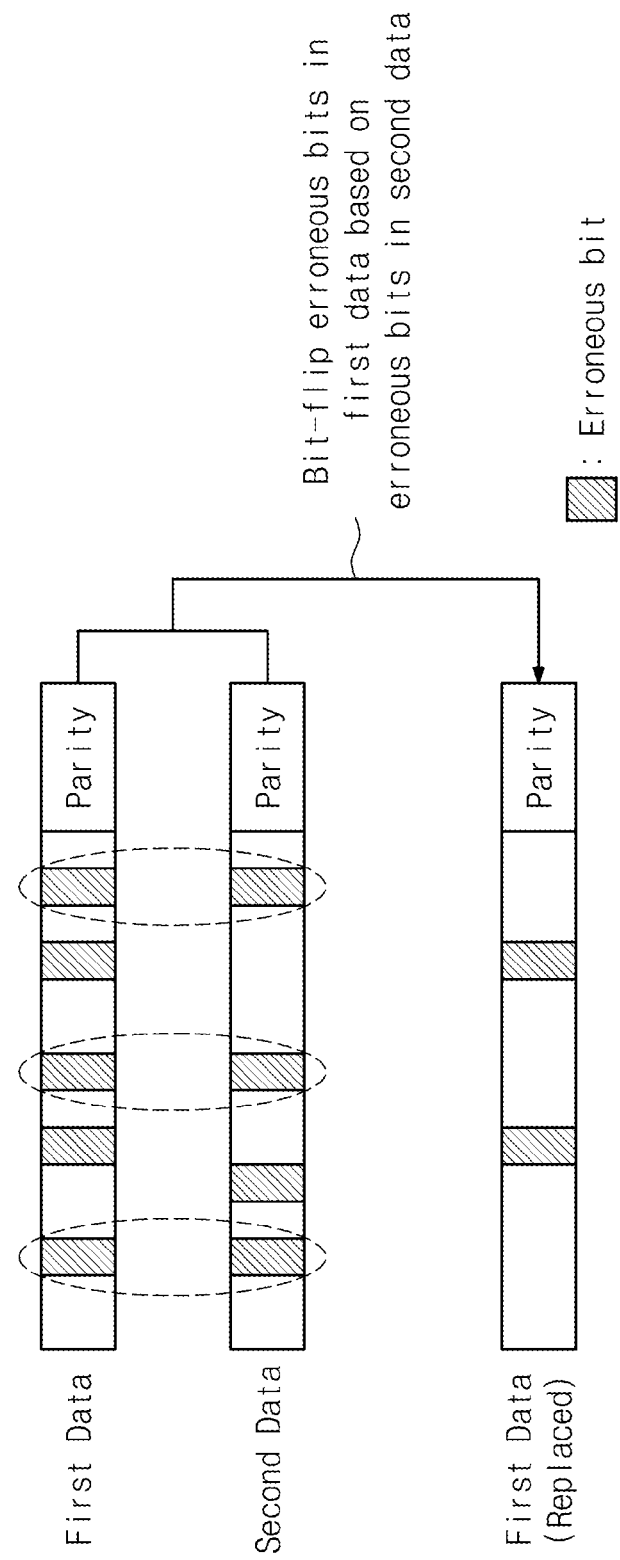
FIGS. 6 and 7 are conceptual diagrams illustrating respective examples of data being varied according to the data correction method of FIG. 5.
Figure 7:
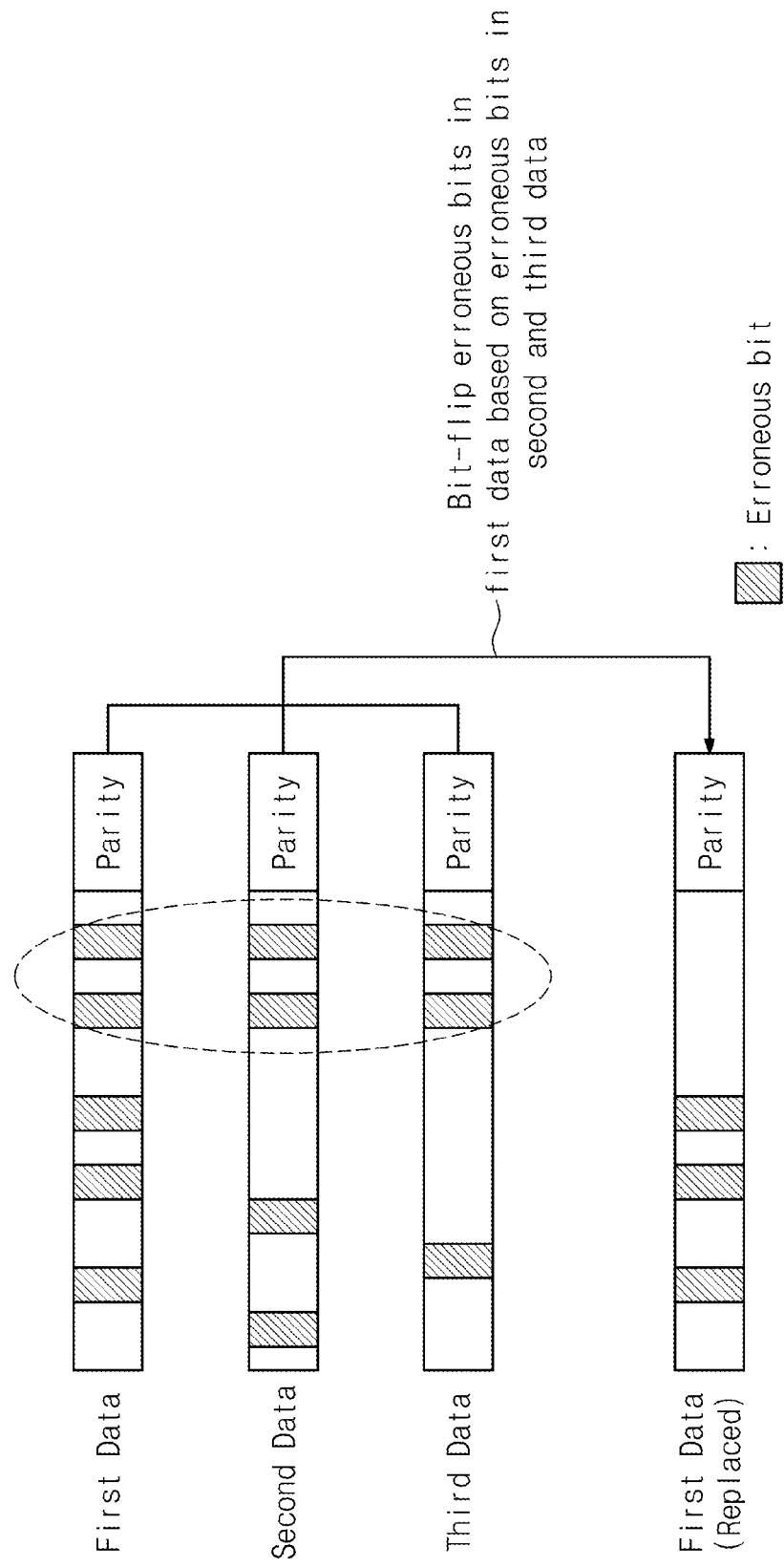

FIGS. 6 and 7 are conceptual diagrams illustrating respective examples of data being modified according to the data correction method of FIG. 5.

For purposes of this description, it is assumed that the ECC 1250 of the memory controller 1200 is capable of detecting and correcting up to four (4) erroneous bits in retrieved read data. (That is, the established error correction capability of the memory system is between 1 and 4 erroneous bits). However, the first read data retrieved from the nonvolatile memory device 1400 include five (5) erroneous bits in the example illustrated in FIG. 6. Accordingly, the error correction capability provided by the ECC 1250 is exceeded and the first read data is deemed uncorrectable (S110=NO in FIG. 5). Nonetheless, despite the fact that the number of erroneous bits falls outside the established error correction capabilities of the memory system 1000, embodiments of the inventive concept are able to further address the matter and seek to correct a rationally modified version of the first read data. The memory controller 1200 does this by modifying the erroneous bits of the first read data using property information derived from the second read data associated with the first read data (e.g., location information for erroneous bits identified in the second read data).

As described above, the number of erroneous bits may increase when a threshold voltage distribution corresponding to an erase state suffers disturbance due to the coupling and/or a read voltage. In this case, as illustrated in FIGS. 1B and 1C, a threshold voltage distribution corresponding to an erase state may be overlapped with a threshold voltage distribution (s) corresponding to a program state(s). This may mean that a data bit of a memory cell having a program state is read inversely due to the threshold voltage distribution corresponding to the erase state. For this reason, erroneous bits included in the first read data may be partially corrected (or modified) according to erroneous bits included in the second read data. However, it is well understood that an error correction reference is not limited thereto. For example, in case that a threshold voltage distribution is varied due to the charge loss, erroneous bits included in the first read data may be partially corrected (or modified) according to erroneous bits included in the second read data.

In a case where the number of erroneous bits of the first read data is exceeds the correctable number of bits, the second read data associated with the first read data may be read from the nonvolatile memory device 1400 under the control of the memory controller 1200. Herein, the second read data may be data read from memory cells in which the first read data is stored. That is, the first read data and the second read data may be read from memory cells connected to the same word line. Like the first read data, locations of erroneous bits included in the second read data may be detected. Afterwards, there may be corrected values of bits (erroneous bits marked by a dotted line in FIG. 6) in the first read data that are placed at the same locations as erroneous bits included in the second read data. That is, bits included in the first read data may be bit flipped based on erroneous bits included in the second read data. After bit flipping of erroneous bits in the first read data, the first read data may be corrected using the established parity data associated with the first read data. Since the number of erroneous bits of the first read data belongs to the correctable coverage (e.g., four error bits) via the bit flipping, the first read data may be corrected based on associated parity data.

In the event that the first read data is uncorrectable, location information of erroneous bits of the second read data associated with the first read data may be detected, and at least one of the erroneous bits of the first read data may be modified according to the detected location information. However, modification of the erroneous bits in a first read data may be made in relation to any one or more of the pages associated with the first read data. This will be more fully described.

In FIG. 7, it is again assumed that that the ECC 1250 of the memory controller 1200 is capable of correcting up to four (4) erroneous bits. Again, the first read data retrieved from the nonvolatile memory device 1400 is assumed to include five (5) erroneous bits as illustrated in FIG. 7. Hence, conventionally in would be impossible to correct an erroneous bit in the first read data using the ECC 1250. However, for embodiments of the inventive concept, if the number of erroneous bits in the first read data exceeds the number of correctable bits, the memory controller 1200 may nonetheless correct erroneous bits in a modified version of the first read data using property information for a second read data and/or a third read data associated with the first read data (e.g., location information of erroneous bits of the second read data and the third read data).

In a case where the number of erroneous bits of the first read data is over the correctable bit number, the second read data associated with the first read data may be read from the nonvolatile memory device 1400 under the control of the memory controller 1200. Like the first read data, locations of erroneous bits included in the second read data may be detected. Further, the third read data associated with the first read data may be read from the nonvolatile memory device 1400 under the control of the memory controller 1200. Like the first read data, locations of erroneous bits included in the third read data may be detected.

Afterwards, there may be corrected (or modified) values of bits (erroneous bits marked by a dotted line in FIG. 7) in the first read data that have a similar location as erroneous bits included in the second read data and the third read data. That is, bits included in the first read data may be bit flipped based on erroneous bits included in the second read data and the third read data. After bit flipping of bits in the first read data, the resulting modified first read data may be corrected using the parity data associated with the first read data. Since the number of erroneous bits in the modified first read data (e.g., three error bits) now falls within the correctable coverage (e.g., four error bits), the modified first read data may be corrected using the associated parity data.

Figure 8:
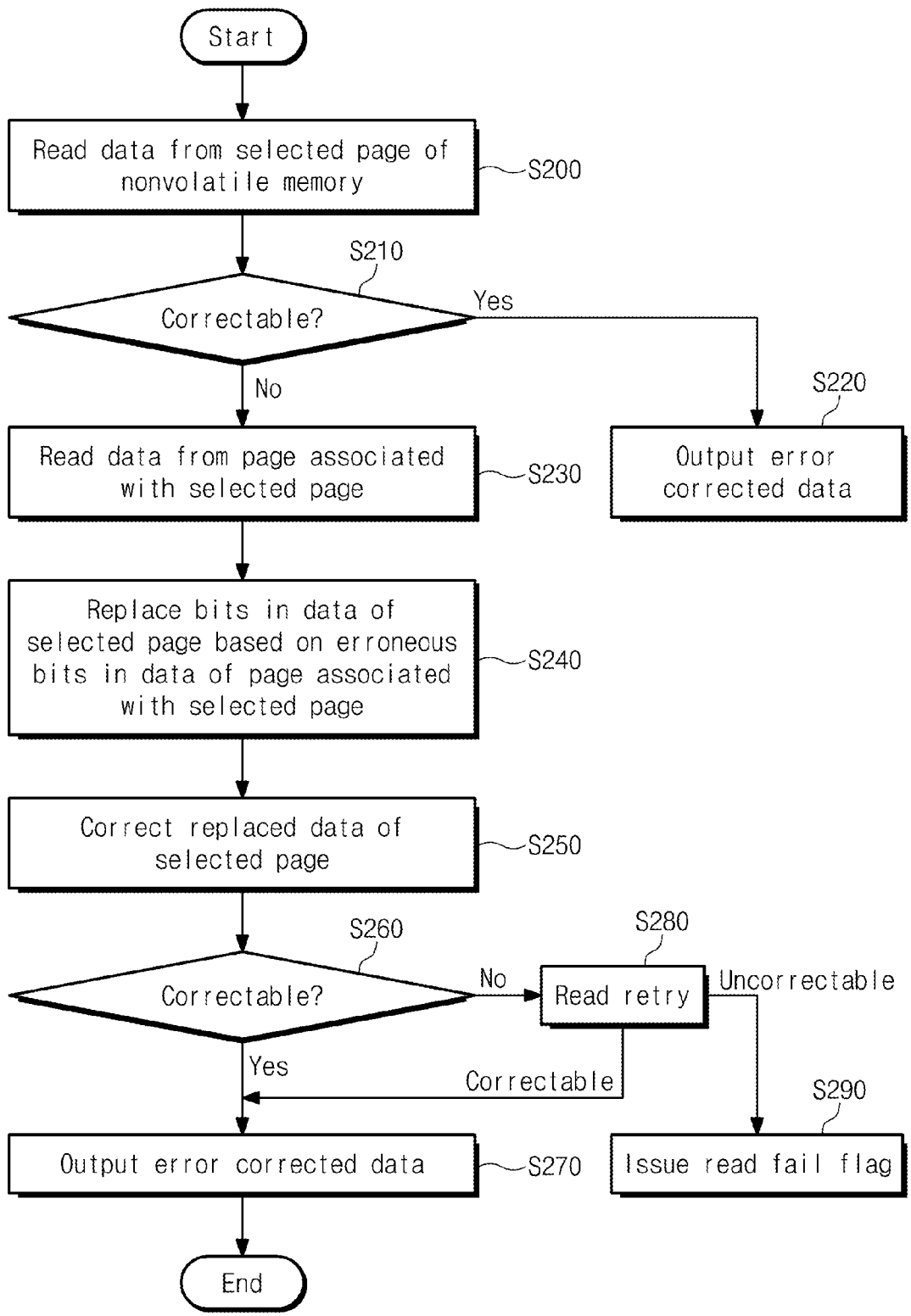
FIG. 8 is a flowchart summarizing a data correction method for a memory system according to another embodiment of the inventive concept.

FIG. 8 is a flowchart summarizing a data correction method for a memory system according to another embodiment of the inventive concept.

Within the illustrated flowchart of FIG. 8, operations S200, S210, S220, S230, S240, S250, S260, and S270 are analogous to operations S100, S110, S120, S130, S140, S150, S160, and S170 previously summarized in relation to FIG. 5, except not only the second read page but also the third read page is interrogated for property information during the erroneous bit modification step(s). Accordingly, these operations will not be respectively described here.

However, if in the flowchart of FIG. 8 the modified first read data is deemed uncorrectable (S260=NO), the modified first read data may be subjected to a so-called "read retry" operation in operation S280. One example of a read retry operation is disclosed, for example, in published U.S. Patent Application No. 2010/0322007, the subject matter of which is hereby incorporated by reference.

Upon a successful read retry operation, the modified first read data may be corrected and resulting error corrected data output in operation S270. However, if the read retry operation is unsuccessful, the modified first read data is deemed uncorrectable and in operation S290 a read fail flag is generated.

In regard to the foregoing, a read fail flag may be generated when the number of erroneous bits in the second read data (or the second and third read data) exceeds the error correction coverage of the memory system 1000.

In the foregoing example embodiments, a bit flip operation directed to erroneous bits in otherwise uncorrectable data is performed under the control of the memory controller 1200. Alternatively, a bit flip operation directed to erroneous bits in otherwise uncorrectable data may be performed within the nonvolatile memory device under the control of the memory controller 1200. For example, uncorrectable data may be temporarily stored in the page buffer circuit 1450 of the nonvolatile memory device 1400, and erroneous bits of the temporarily stored data may be provided to the nonvolatile memory device 1400 via a random data input operation using error location information that is detected according to data associated with the uncorrectable data. Afterwards, the modified data (bit-flipped page data), which is temporarily stored in the page buffer circuit 1450 and is bit-flipped via the random data input operation, may be provided to the memory controller 1200. The memory controller 1200 may correct an error of the bit-flipped data based on parity data.

Figure 9:
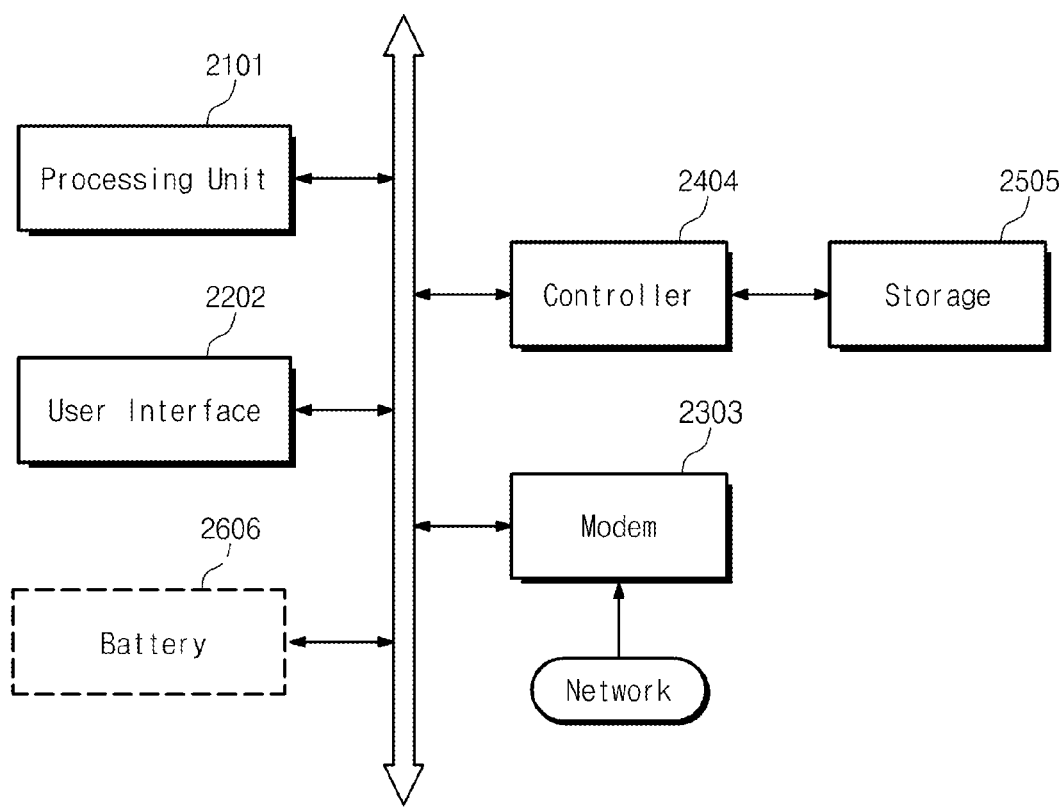
FIG. 9 is a block diagram illustrating a computational system according to an embodiment of the inventive concept.

FIG. 9 is a block diagram showing a computational system according to an embodiment of the inventive concept.

A computational system may include a processing unit 2101, a user interface 2202, a modem 2303 such as a baseband chipset, a memory controller 2404, and a nonvolatile memory device 2505 as a storage media. The memory controller 2404 and the nonvolatile memory device 2505 may be substantially equal to that illustrated in FIG. 2. That is, in the event that first read data read from the nonvolatile memory device 2505 is uncorrectable, the memory controller 2404 may correct a part of erroneous bits included in the first read data via a bit flip operation, based on error location information of a part of all of data associated with the first read data. Afterwards, the memory controller 2404 may correct an error of the first read data being bit flipped. As a result, an error of data getting out of the error correction coverage may be corrected without expanding the error correction capacity of an ECC of the memory controller 2404. N-bit data (N being 1 or more integer) processed/to be processed by the processing unit 2101 may be stored in the nonvolatile memory device 2505 through the memory controller 2404. In the event that the computational system is a mobile device, a battery 2606 may be further included in the computational system to supply an operating voltage thereto. Although not illustrated in FIG. 9, the computational system may further comprise an application chipset, a camera image processor (CIS), a mobile DRAM, and the like.

Figure 10:
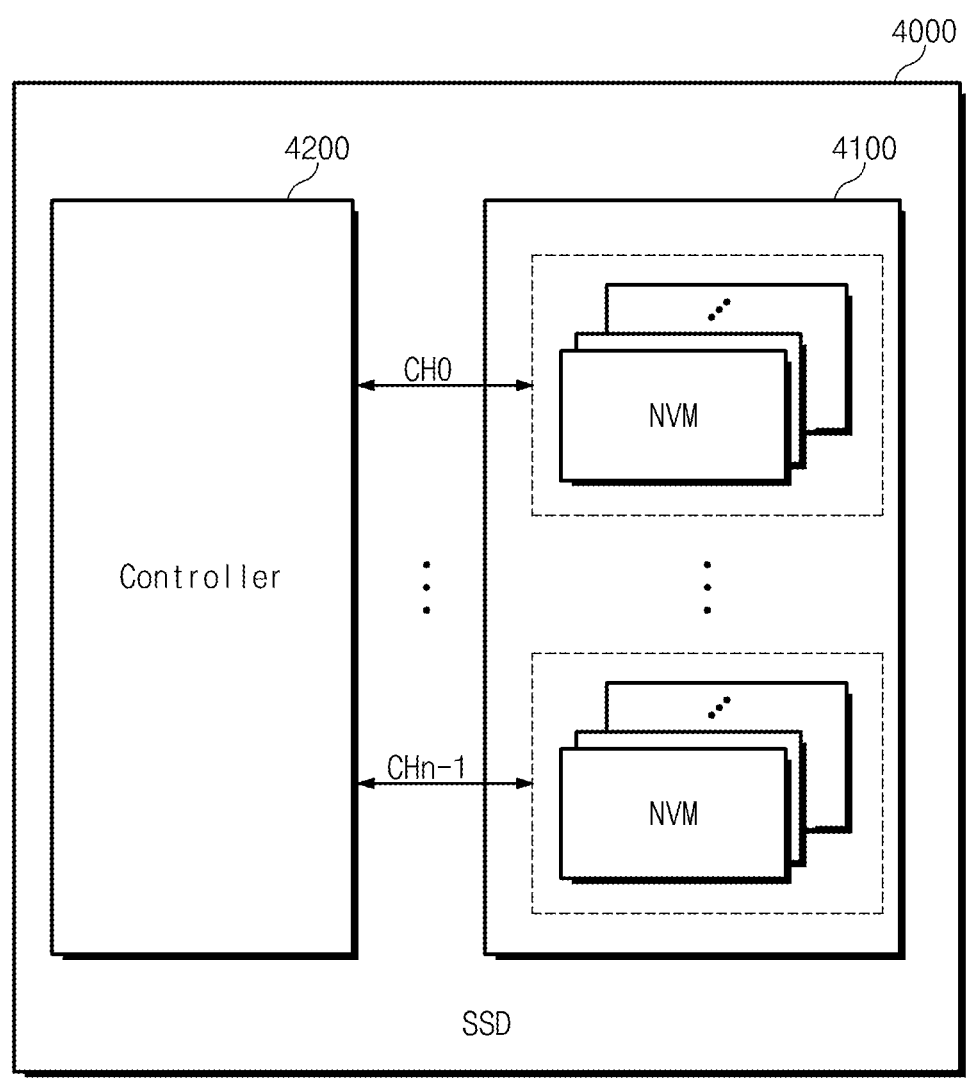
FIG. 10 is a block diagram illustrating a solid state drive (SSD) according to an embodiment of the inventive concept.

FIG. 10 is a block diagram showing a solid state drive according to an embodiment of the inventive concept.

Referring to FIG. 10, a solid state drive (SSD) 4000 may comprise storage medium 4100 and a controller 4200. The storage medium 4100 may be connected with the controller 4200 via a plurality of channels, each of which is connected in common to a plurality of nonvolatile memories. The controller 4200 and each nonvolatile memory may be configured the same as illustrated in FIG. 2. That is, in the event that first read data read from a nonvolatile memory is uncorrectable, the controller 4200 may correct a part of erroneous bits included in the first read data via a bit flip operation, based on error location information of a part of all of data associated with the first read data. Afterwards, the controller 4200 may correct an error of the first read data bit-flipped. As a result, an error of data getting out of the error correction coverage may be corrected without expanding the error correction capacity of an ECC of the controller 4200.

Figure 11:
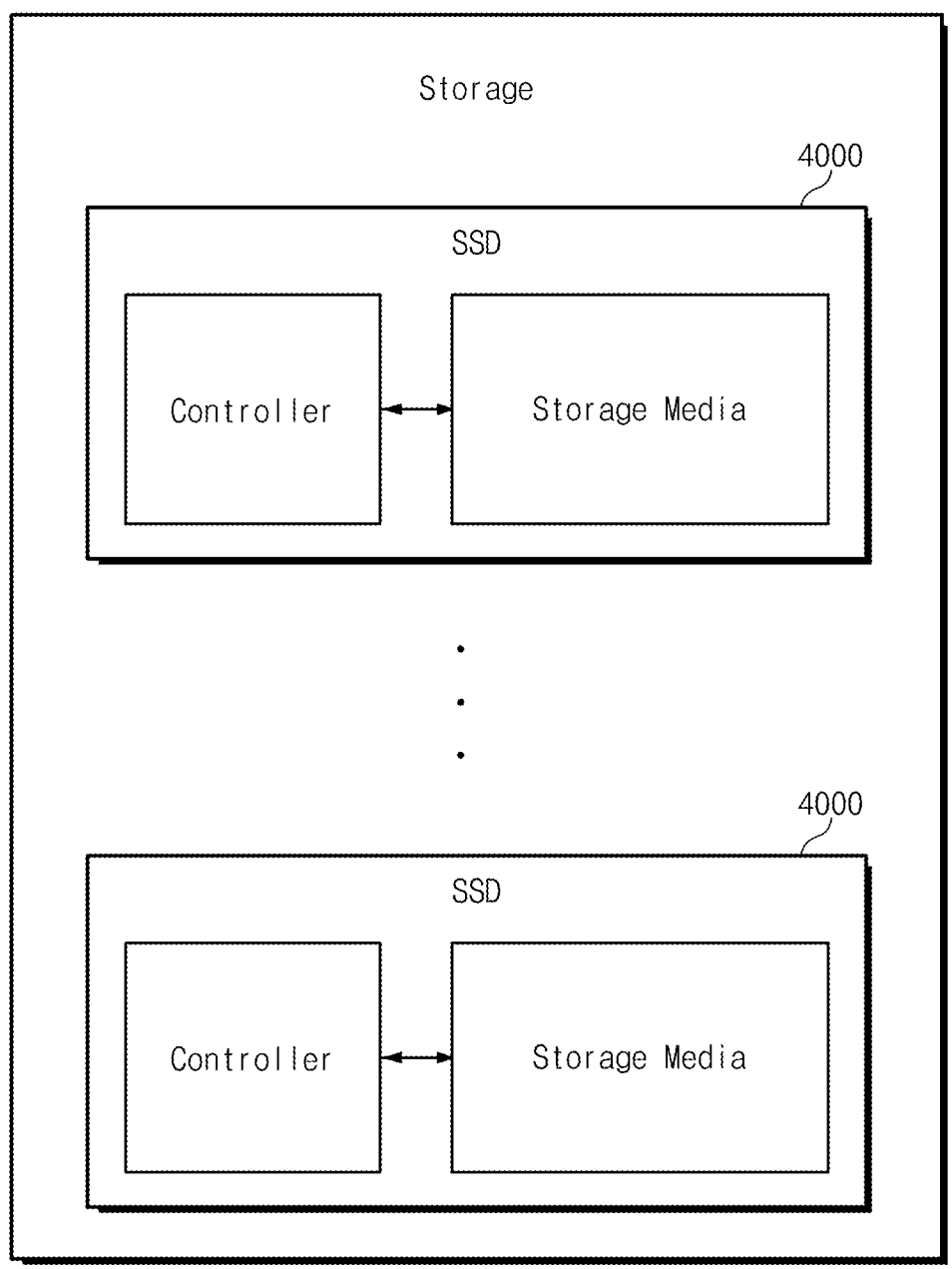
FIG. 11 is a block diagram further illustrating the SSD of FIG. 10.
Figure 12:
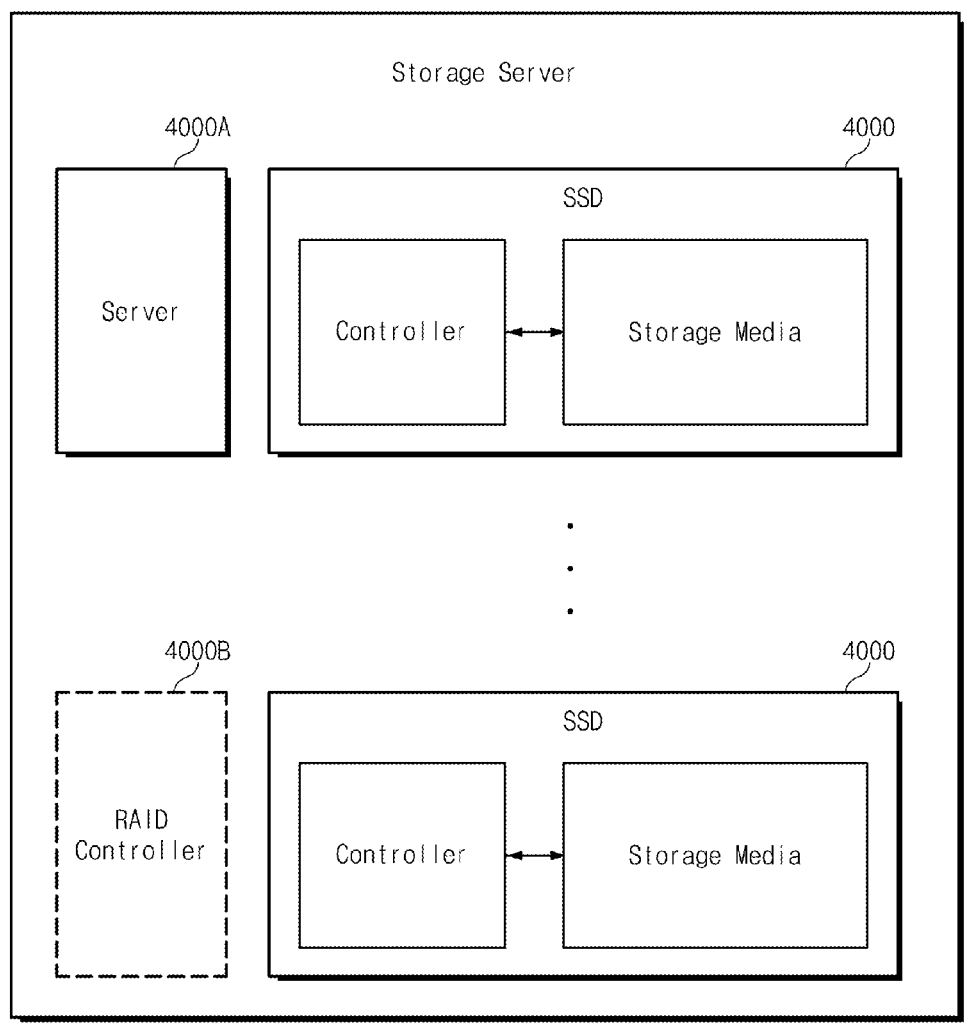
FIG. 12 is a block diagram further illustrating a storage server that may be used in conjunction with the SSD of FIG. 10.

FIG. 11 is a block diagram showing a storage using a solid state drive in FIG. 10, and FIG. 12 is a block diagram showing a storage server using a solid state drive in FIG. 10.

An SSD 4000 according to an embodiment of the inventive concept may be used to form the storage. As illustrated in FIG. 11, the storage includes a plurality of solid state drives 4000 which are configured the same as described in FIG. 10. An SSD 4000 according to an embodiment of the inventive concept is used to configure a storage sever. As illustrated in FIG. 12, a storage server includes a plurality of solid state drives 4000, which are configured the same as described in FIG. 10, and a server 4000A. Further, it is well comprehended that a well-known RAID controller 4000B is provided in the storage server.

Figure 13:
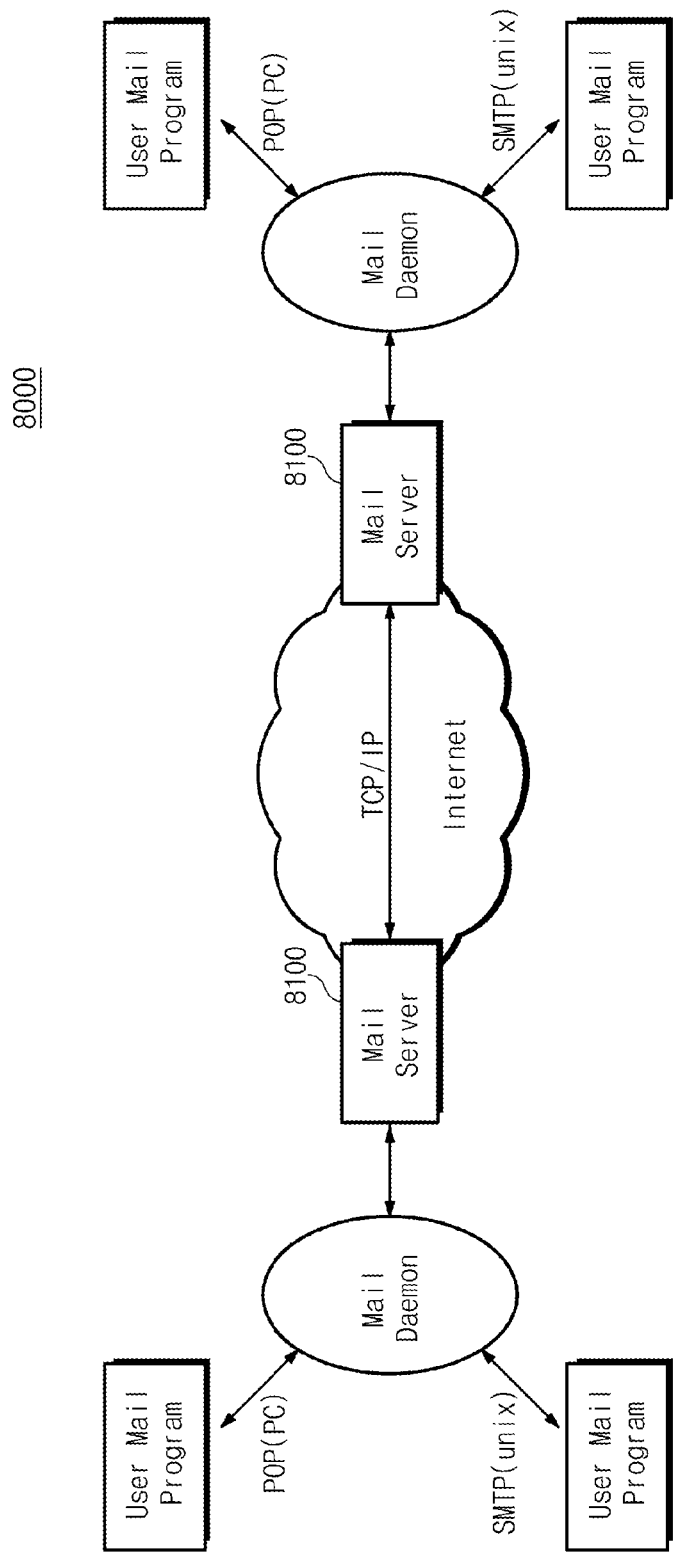
FIG. 13 is a diagram illustrating a system to which a data storage device according to an embodiment of the inventive concept may be applied.

FIG. 13 is a diagram schematically illustrating a system to which a data storage device according to an embodiment of the inventive concept is applied.

As illustrated in FIG. 13, a solid state drive including a data storage device according to an embodiment of the inventive concept may be applied to a mail server 8100.

Figure 14:
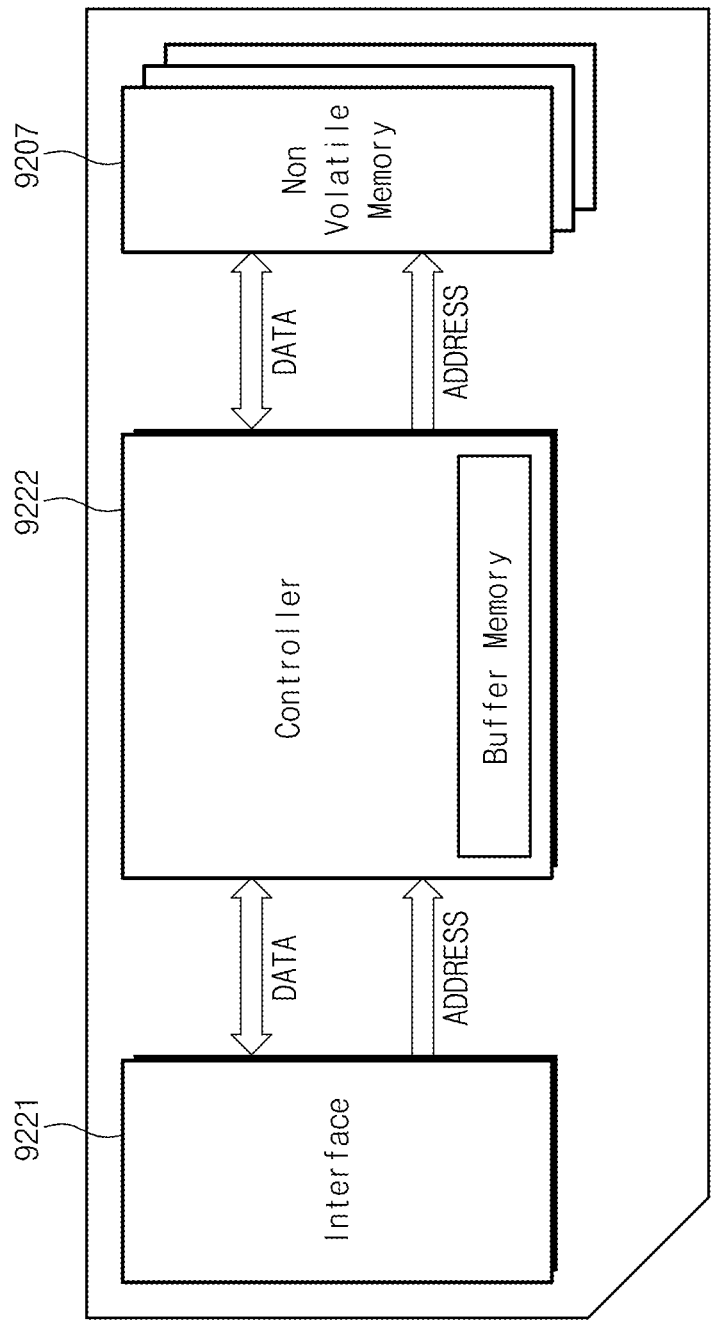
FIG. 14 is a block diagram illustrating a memory card according to an embodiment of the inventive concept.

FIG. 14 is a block diagram illustrating a memory card according to an embodiment of the inventive concept.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 14, the memory card may include an interface circuit 9221 for interfacing with an external device, a controller 9222 including a buffer memory and controlling an operation of the memory card, and at least one nonvolatile memory device 9207. The controller 9222 may be a processor which is configured to control write and read operations of the non-volatile memory device 9207. In particular, the controller 9222 may be coupled with the non-volatile memory device 9207 and the interface circuit 2221 via a data bus and an address bus. The controller 9222 and the non-volatile memory device 9207 may correspond to a memory controller and a nonvolatile memory device described in FIG. 2, respectively. That is, in the event that first read data read from a nonvolatile memory device 9207 is uncorrectable, the controller 9222 may correct a part of erroneous bits included in the first read data via a bit flip operation, based on error location information of a part of all of data associated with the first read data. Afterwards, the controller 9222 may correct an error of the first read data bit-flipped. As a result, an error of data getting out of the error correction coverage may be corrected without expanding the error correction capacity of an ECC of the controller 9222.

Figure 15:
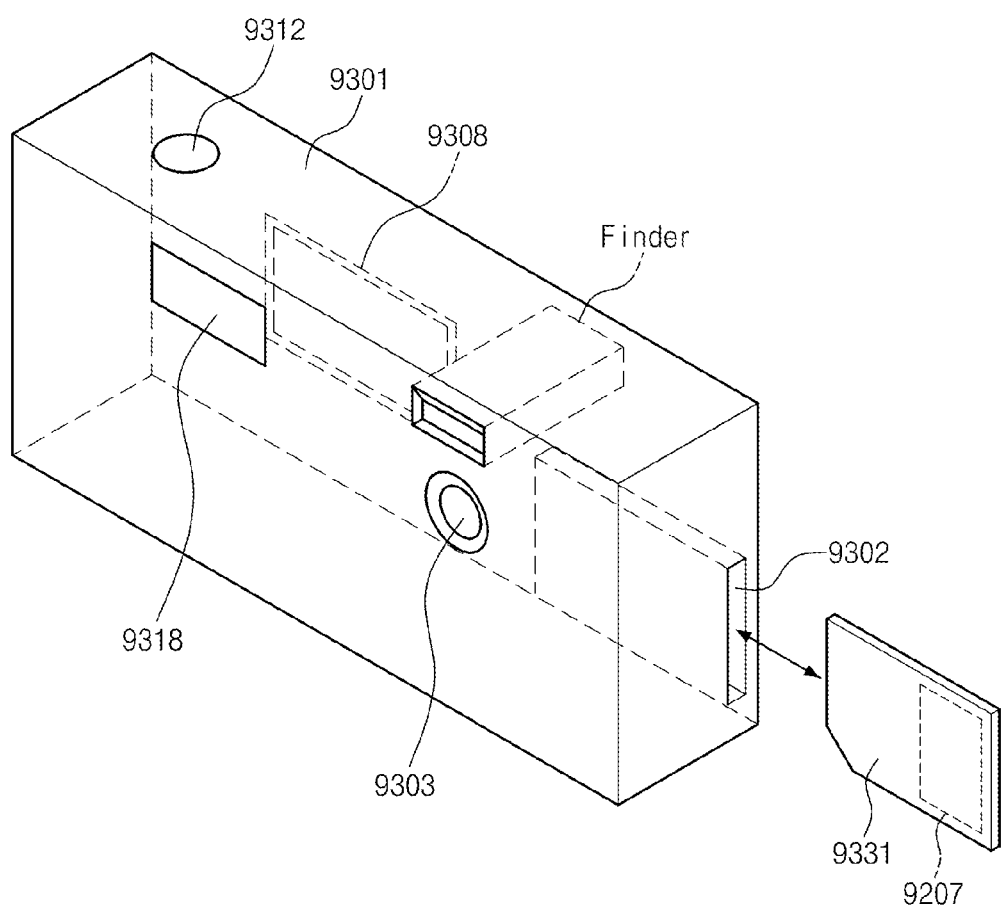
FIG. 15 is a block diagram illustrating a digital still camera according to an embodiment of the inventive concept.

FIG. 15 is a block diagram illustrating a digital still camera according to an embodiment of the inventive concept.

Referring to FIG. 15, a digital still camera may include a body 9301, a slot 9302, a lens 9303, a display circuit 9308, a shutter button 9312, a strobe 9318, and the like. In particular, a memory card 9331 is inserted in the slot 9308 and includes a memory controller and a nonvolatile memory device described in FIG. 2. That is, in the event that first read data read from the nonvolatile memory device is uncorrectable, the memory controller may correct a part of erroneous bits included in the first read data via a bit flip operation, based on error location information of a part of all of data associated with the first read data. Afterwards, the memory controller may correct an error of the first read data bit-flipped. As a result, an error of data getting out of the error correction coverage may be corrected without expanding the error correction capacity of an ECC of the memory controller.

If the memory card 9331 has a contact type, an electric circuit on a circuit board is electrically contacted with the memory card 9331 when it is inserted in the slot 9308. In the event that the memory card 9331 has a non-contact type, an electric circuit on a circuit board communicates with the memory card 9331 in a radio-frequency manner.

Figure 16:
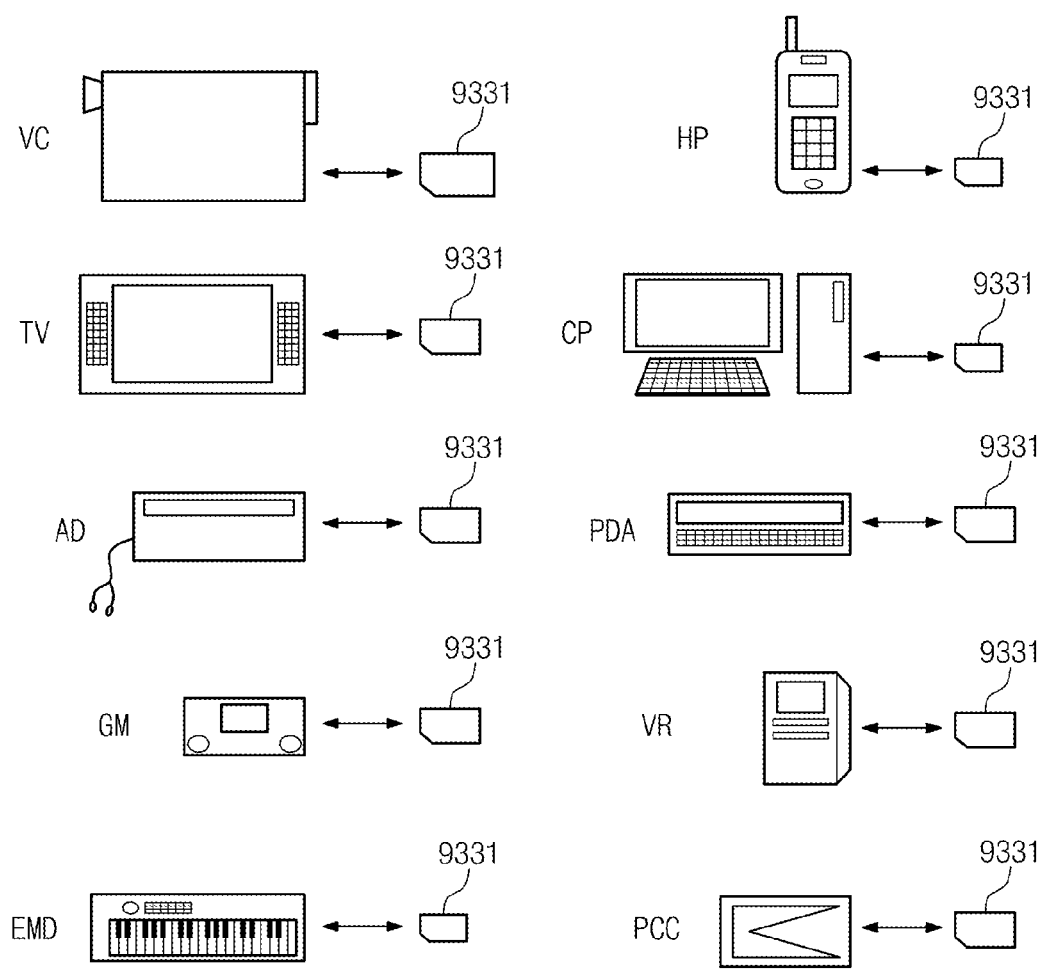
FIG. 16 is a collection of product diagrams illustrating various systems to which the memory card of FIG. 14 may be applied.

FIG. 16 is a diagram illustrating various systems to which a memory card in FIG. 14 is applied.

Referring to FIG. 16, a memory card 9331 may be applied to a video camera VC, a television TV, an audio device AD, a game machine GM, an electronic music device EMD, a cellular phone HP, a computer CP, a Personal Digital Assistant PDA, a voice recorder VR, a PC card PCC, and the like.

In an embodiment of the inventive concept, memory cells can be formed of a variable resistance memory cell. An exemplary variable resistance memory cell and a memory device including the same are disclosed in U.S. Pat. No. 7,529,124, the entirety of which is incorporated by reference herein.

In another embodiment of the inventive concept, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

Memory device(s) having a charge trap flash structure as a charge storage layer is disclosed, for example, in U.S. Pat. No. 6,858,906 and published U.S. Patent Application Nos. 2004/0169238 and 2006/0180851, the collective subject matter of which is hereby incorporated by reference. As a further background example, a source-drain free flash structure is disclosed in Korean Patent Document No. 673020.

A nonvolatile memory device and/or a memory controller according to the inventive concept may be packed using various types of packages. For example, A non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the scope of the following claims. Thus, to the maximum extent allowed by law, the scope is to be determined by the broadest permissible interpretation of the following claims and their equivalents, and shall not be restricted or limited by the foregoing detailed description.

What is claimed is:

1. In a memory system including a memory controller controlling a nonvolatile memory device having a memory cell array of multi-level memory cells (MLC), wherein the memory system includes an error correcting circuit (ECC) generating parity data capable of correcting "Q" erroneous bits in read data retrieved from the memory device, where Q is a natural number, a correction method, comprising:
   retrieving first read data from a plurality of the MLC commonly coupled to a word line in response to a read command;
   determining whether or not the first read data is correctable in view of first parity data generated by the ECC from the first read data;
   upon determining that the first read data is not correctable, reading second read data from the plurality of the MLC and obtaining error information for the second read data in view of second parity data generated by the ECC from the second read data;
   comparing error information obtained for the first read data with the error information for the second read data; and
   modifying at least one erroneous bit in the first read data based on said comparison of the error information for the second read data and the error information for the first read data.

2. The error correcting method of claim 1, wherein the MLC are each configured to store 2-bit data including a Most Significant Bit (MSB) data page and a Least Significant Bit (LSB) data page, and
   the first read data is at least part of one of the MSB data page and the LSB data page, and the second read data is at least part of the other one of the MSB data page and the LSB data page.

3. The error correcting method of claim 1, wherein the MLC are each configured to store M data pages, where M is an integer greater than 2, and
   the first read data is at least part of one of the M data pages, and the second read data is at least part of a different one of the M data pages.

4. The error correcting method of claim 1, wherein the first read data includes "P" erroneous bits, where P is greater than Q.

5. The error correcting method of claim 4, wherein the second read data includes no more than Q erroneous bits.

6. The error correcting method of claim 5, wherein the error information for the first read data is location information for each erroneous bit in the first read data, and the error information for the second read data is location information for each erroneous bit in the second read data.

7. The error correcting method of claim 6, wherein modifying the at least one erroneous bit in the first read data comprises:
   temporarily storing the error information for the first read data and the error information for the second read data in the memory cell array;
   identifying the at least one erroneous bit in the first read data as having a counterpart at least one erroneous bit in the second read data based on said comparison; and bit-flipping the at least one erroneous bit in the first read data to generate modified first read data.

8. The error correcting method of claim 7, further comprising:
    determining whether or not the modified first read data is correctable in view of the first parity data generated by the ECC from the first read data; and
    upon determining that the modified first read data is correctable, correcting the modified first read data using the first parity data.

9. The error correcting method of claim 8, further comprising:
    upon determining that the modified first read data is not correctable, performing a read retry operation on the modified first read data.

10. The error correcting method of claim 7, wherein the bit flipping of the at least one erroneous bit in the first read data is performed within the memory controller.

11. The error correcting method of claim 7, wherein the bit flipping of the at least one erroneous bit in the first read data is performed in the nonvolatile memory device under the control of the memory controller.

12. The error correcting method of claim 7, wherein each of the MLC is a multi-bit flash memory cell.

13. A memory system, comprising:
    a memory controller configured to control operation of a nonvolatile memory device and including an error correcting circuit (ECC) that generates parity data capable of correcting "Q" erroneous bits in read data retrieved from the memory device, where Q is a natural number; and
    the nonvolatile memory device includes a memory cell array of multi-level memory cells (MLC),
    wherein the memory controller is further configured to retrieve first read data from a plurality of the MLC commonly coupled to a word line in response to a read command, determine whether or not the first read data is correctable in view of first parity data generated by the ECC from the first read data, upon determining that the first read data is not correctable reading second read data from the plurality of the MLC and obtaining error information for the second read data in view of second parity data generated by the ECC from the second read data, comparing error information obtained for the first read data with the error information for the second read data, and modifying at least one erroneous bit in the first read data based on the comparison of the error information for the second read data and the error information for the first read data.

14. The memory system of claim 13, wherein the MLC are each configured to store 2-bit data including a Most Significant Bit (MSB) data page and a Least Significant Bit (LSB) data page, and
    the first read data is at least part of one of the MSB data page and the LSB data page, and the second read data is at least part of the other one of the MSB data page and the LSB data page.

15. The memory system of claim 13, wherein the MLC are each configured to store M data pages, where M is an integer greater than 2, and
    the first read data is at least part of one of the M data pages, and the second read data is at least part of a different one of the M data pages.

16. The memory system of claim 13, wherein the first read data includes "P" erroneous bits, where P is greater than Q.

17. The memory system of claim 16, wherein the second read data includes not more than Q erroneous bits.

18. The memory system of claim 17, wherein the error information for the first read data is location information for each erroneous bit in the first read data, and the error information for the second read data is location information for each erroneous bit in the second read data.

19. The memory system of claim 17, wherein the memory controller is further configured during the modifying of the at least one erroneous bit in the first read data to temporarily store the error information for the first read data and the error information for the second read data in the memory cell array, identify the at least one erroneous bit in the first read data as having a counterpart at least one erroneous bit in the second read data based on the comparison, and bit-flip the at least one erroneous bit in the first read data to generate modified first read data.

20. The memory system of claim 19, wherein the memory controller is further configured to determine whether or not the modified first read data is correctable in view of the first parity data generated by the ECC from the first read data, and upon determining that the modified first read data is correctable, correcting the modified first read data using the first parity data.

* * * * *